United States Patent
Subramanian et al.

(10) Patent No.: US 10,872,012 B2
(45) Date of Patent: Dec. 22, 2020

(54) XOR RECOVERY SCHEMES UTILIZING EXTERNAL MEMORY

(71) Applicant: Western Digital Technologies, Inc., San Jose, CA (US)

(72) Inventors: Karthik Subramanian, Bangalore (IN); Vinay Vijendra Kumar Lakshmi, Bangalore (IN); Manohar Srinivasiah, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/243,070

(22) Filed: Jan. 8, 2019

(65) Prior Publication Data

US 2020/0218605 A1     Jul. 9, 2020

(51) Int. Cl.
*G06F 11/10* (2006.01)
*G11C 29/52* (2006.01)
*G06F 11/32* (2006.01)

(52) U.S. Cl.
CPC ...... *G06F 11/1068* (2013.01); *G06F 11/1004* (2013.01); *G11C 29/52* (2013.01)

(58) Field of Classification Search
CPC ............. G06F 11/1068; G06F 11/1004; G06F 11/1076; G06F 11/1092; G06F 11/1096; G11C 29/52
See application file for complete search history.

(56) References Cited

U.S. PATENT DOCUMENTS

| | | | | |
|---|---|---|---|---|
| 8,959,420 B1* | 2/2015 | Piszczek | ................ | G06F 12/10 714/801 |
| 10,474,527 B1* | 11/2019 | Sun | ....................... | G06F 11/108 |
| 2004/0003165 A1* | 1/2004 | Schulz | ............... | G06F 11/1032 711/5 |
| 2005/0050384 A1* | 3/2005 | Horn | .................... | G06F 11/1076 714/6.13 |
| 2007/0055905 A1* | 3/2007 | Chou | .................. | G06F 11/1076 714/6.12 |
| 2007/0103296 A1* | 5/2007 | Paessel | ............... | G06F 19/3418 340/539.22 |
| 2008/0201619 A1* | 8/2008 | Kosaki | .............. | G11B 20/0021 714/699 |

(Continued)

OTHER PUBLICATIONS

Li et al., A Reliable Scheme for Cluster Storage System, IEEE, Conference Paper, pp. 394-397 (Year: 2007).*

(Continued)

*Primary Examiner* — Cynthia Britt
*Assistant Examiner* — Dipakkumar B Gandhi
(74) *Attorney, Agent, or Firm* — Chang & Hale LLP

(57) ABSTRACT

A storage device includes a storage controller, non-volatile memory, volatile memory and a communication interface configured to connect to external volatile memory of a host system. The storage controller is configured to receive data from the host system for storing in the non-volatile memory, buffer the data in the volatile memory, obtain parity data corresponding to the buffered data from an external volatile memory within the host system, compute XOR parity data for the buffered data based on the parity data and the buffered data, store the computed XOR parity data on the external volatile memory, and write the data from the host to the non-volatile memory.

20 Claims, 10 Drawing Sheets

(56) References Cited

U.S. PATENT DOCUMENTS

| | | | |
|---|---|---|---|
| 2012/0239855 A1* | 9/2012 | Tootoonchian | G06F 12/0246 |
| | | | 711/103 |
| 2014/0068319 A1* | 3/2014 | Daly | G11C 7/1006 |
| | | | 714/6.2 |
| 2016/0085625 A1* | 3/2016 | Amato | G06F 3/0619 |
| | | | 714/766 |
| 2018/0129430 A1* | 5/2018 | Kang | G06F 3/0619 |
| 2019/0065309 A1* | 2/2019 | Chiang | G06F 11/1068 |

OTHER PUBLICATIONS

Li et al., A Novel Collaborative Fault-Tolerance Mechanism for Metadata Server Cluster, IEEE, Conference Paper, pp. 495-500 (Year: 2007).*

* cited by examiner

Figure 6A

|    |        |      | Fim0 |     |     |     | Fim1 |     |     |     |            |
|----|--------|------|------|-----|-----|-----|------|-----|-----|-----|------------|
|    |        |      | Die0 |     |     |     | Die0 |     |     |     |            |
| WL | String | Page | PL0  | PL1 | PL2 | PL3 | PL0  | PL1 | PL2 | PL3 |            |
| 0  | 0      | 0    | 0    | 4   | 1   | 5   | 2    | 6   | 3   | 7   | X0         |
|    | 1      | 1    | 1    | 5   | 2   | 6   | 3    | 7   | 4   | 0   | X1         |
|    | 2      | 2    | 2    | 6   | 3   | 7   | 4    | 0   | 5   | 1   | X2         |
|    | 3      | 3    | 3    | 7   | 4   | 0   | 5    | 1   | 6   | 2   | X3         |
| 1  | 0      | 4    | 4    | 0   | 5   | 1   | 6    | 2   | 7   | 3   | X4         |
|    | 1      | 5    | 5    | 1   | 6   | 2   | 7    | 3   | 0   | 4   | X5         |
|    | 2      | 6    | 6    | 2   | 7   | 3   | 0    | 4   | 1   | 5   | X6         |
|    | 3      | 7    | 7    | 3   | 0   | 4   | 1    | 5   | 2   | 6   | X7         |
|    |        |      | Y0   | Y1  | Y2  | Y3  | Y4   | Y5  | Y6  | Y7  | XOR Parity |

1st XOR Dimension (right side); 2nd XOR Dimension (bottom)

Figure 6B

|    |        |      | Fim0 |     |     |     | Fim1 |     |     |     |
|----|--------|------|------|-----|-----|-----|------|-----|-----|-----|
|    |        |      | Die0 |     | Die1 |    | Die0 |     | Die1 |    |
| WL | String | Page | PL0  | PL1 | PL0 | PL1 | PL0  | PL1 | PL0 | PL1 |
| 0  | 0      | 0    | 0    | 12  | 4   | 8   | 0    | 12  | 4   | 8   |
|    | 1      | 1    | 1    | 13  | 5   | 9   | 1    | 13  | 5   | 9   |
|    | 2      | 2    | 2    | 14  | 6   | 10  | 2    | 14  | 6   | 10  |
|    | 3      | 3    | 3    | 15  | 7   | 11  | 3    | 15  | 7   | 11  |
| 1  | 0      | 4    | 4    | 8   | 0   | 12  | 4    | 8   | 0   | 12  |
|    | 1      | 5    | 5    | 9   | 1   | 13  | 5    | 9   | 1   | 13  |
|    | 2      | 6    | 6    | 10  | 2   | 14  | 6    | 10  | 2   | 14  |
|    | 3      | 7    | 7    | 11  | 3   | 15  | 7    | 11  | 3   | 15  |
| 2  | 0      | 8    | 0    | 12  | 4   | 8   | 0    | 12  | 4   | 8   |
|    | 1      | 9    | 1    | 13  | 5   | 9   | 1    | 13  | 5   | 9   |
|    | 2      | 10   | 2    | 14  | 6   | 10  | 2    | 14  | 6   | 10  |
|    | 3      | 11   | 3    | 15  | 7   | 11  | 3    | 15  | 7   | 11  |
| 45 | 0      | 244  | 4    | 8   | 0   | 12  | 4    | 8   | 0   | 12  |
|    | 1      | 245  | 5    | 9   | 1   | 13  | 5    | 9   | 1   | 13  |
|    | 2      | 246  | 6    | 10  | 2   | 14  | 6    | 10  | 2   | 14  |
|    | 3      | 247  | 7    | 11  | 3   | 15  | 7    | 11  | 3   | 15  |
| 46 | 0      | 248  | 0    | 12  | 4   | 8   | 0    | 12  | 4   | 8   |
|    | 1      | 249  | 1    | 13  | 5   | 9   | 1    | 13  | 5   | 9   |
|    | 2      | 250  | 2    | 14  | 6   | 10  | 2    | 14  | 6   | 10  |
|    | 3      | 251  | 3    | 15  | 7   | 11  | 3    | 15  | 7   | 11  |
| 47 | 0      | 252  | 4    | 8   | 0   | 12  | 4    | 8   | 0   | 12  |
|    | 1      | 253  | 5    | 9   | 1   | 13  | 5    | 9   | 1   | 13  |
|    | 2      | 254  | 6    | 10  | 2   | 14  | 6    | 10  | 2   | 14  |
|    | 3      | 255  | 7    | 11  | 3   | 15  | 7    | 11  | 3   | 15  |

Tier Joint

| WL | String | Page | FIM0 Die0 PL0 | PL1 | Die1 PL0 | PL1 | FIM1 Die0 PL0 | PL1 | Die1 PL0 | PL1 |
|---|---|---|---|---|---|---|---|---|---|---|
| 0 | 0 | 0 | 0 | 12 | 4 | 8 | 0 | 12 | 4 | 8 |
|   | 1 | 1 | 1 | 13 | 5 | 9 | 1 | 13 | 5 | 9 |
|   | 2 | 2 | 2 | 14 | 6 | 10 | 2 | 14 | 6 | 10 |
|   | 3 | 3 | 3 | 15 | 7 | 11 | 3 | 15 | 7 | 11 |
| 1 | 0 | 4 | 4 | 8 | 0 | 12 | 4 | 8 | 0 | 12 |
|   | 1 | 5 | 5 | 9 | 1 | 13 | 5 | 9 | 1 | 13 |
|   | 2 | 6 | 6 | 10 | 2 | 14 | 6 | 10 | 2 | 14 |
|   | 3 | 7 | 7 | 11 | 3 | 15 | 7 | 11 | 3 | 15 |
| 2 | 0 | 8 | 0 | 12 | 4 | 8 | 0 | 12 | 4 | 8 |
|   | 1 | 9 | 1 | 13 | 5 | 9 | 1 | 13 | 5 | 9 |
|   | 2 | 10 | 2 | 14 | 6 | 10 | 2 | 14 | 6 | 10 |
|   | 3 | 11 | 3 | 15 | 7 | 11 | 3 | 15 | 7 | 11 |
| 45 | 0 | 244 | 4 | 8 | 0 | 12 | 4 | 8 | 0 | 12 |
|   | 1 | 245 | 5 | 9 | 1 | 13 | 5 | 9 | 1 | 13 |
|   | 2 | 246 | 6 | 10 | 2 | 14 | 6 | 10 | 2 | 14 |
|   | 3 | 247 | 7 | 11 | 3 | 15 | 7 | 11 | 3 | 15 |
| 46 | 0 | 248 | 0 | 12 | 4 | 8 | 0 | 12 | 4 | 8 |
|   | 1 | 249 | 1 | 13 | 5 | 9 | 1 | 13 | 5 | 9 |
|   | 2 | 250 | 2 | 14 | 6 | 10 | 2 | 14 | 6 | 10 |
|   | 3 | 251 | 3 | 15 | 7 | 11 | 3 | 15 | 7 | 11 |
| 47 | 0 | 252 | 4 | 8 | 0 | 12 | 4 | 8 | 0 | 12 |
|   | 1 | 253 | 5 | 9 | 1 | 13 | 5 | 9 | 1 | 13 |
|   | 2 | 254 | 6+12 | 10+0 | 2+8 | 14+4 | 6+12 | 10+0 | 2+8 | 14+4 |
|   | 3 | 255 | 7+13 | 11+1 | 3+9 | 15+5 | 7+13 | 11+1 | 3+9 | 15+5 |

Tier Joint

| WL | String | Page | FIM0 Die0 PL0 | PL1 | Die1 PL0 | PL1 | FIM1 Die0 PL0 | PL1 | Die1 PL0 | PL1 |
|---|---|---|---|---|---|---|---|---|---|---|
| 0 | 0 | 0 | 0 | 12 | 0 | 12 | 0 | 12 | 0 | 12 |
|   | 1 | 1 | 1 | 13 | 1 | 13 | 1 | 13 | 1 | 13 |
|   | 2 | 2 | 2 | 14 | 2 | 14 | 2 | 14 | 2 | 14 |
|   | 3 | 3 | 3 | 15 | 3 | 15 | 3 | 15 | 3 | 15 |
| 1 | 0 | 4 | 4 | 8 | 4 | 8 | 4 | 8 | 4 | 8 |
|   | 1 | 5 | 5 | 9 | 5 | 9 | 5 | 9 | 5 | 9 |
|   | 2 | 6 | 6 | 10 | 6 | 10 | 6 | 10 | 6 | 10 |
|   | 3 | 7 | 7 | 11 | 7 | 11 | 7 | 11 | 7 | 11 |
| 2 | 0 | 8 | 0 | 12 | 0 | 12 | 0 | 12 | 0 | 12 |
|   | 1 | 9 | 1 | 13 | 1 | 13 | 1 | 13 | 1 | 13 |
|   | 2 | 10 | 2 | 14 | 2 | 14 | 2 | 14 | 2 | 14 |
|   | 3 | 11 | 3 | 15 | 3 | 15 | 3 | 15 | 3 | 15 |
| 45 | 0 | 244 | 4 | 8 | 4 | 8 | 4 | 8 | 4 | 8 |
|   | 1 | 245 | 5 | 9 | 5 | 9 | 5 | 9 | 5 | 9 |
|   | 2 | 246 | 6 | 10 | 6 | 10 | 6 | 10 | 6 | 10 |
|   | 3 | 247 | 7 | 11 | 7 | 11 | 7 | 11 | 7 | 11 |
| 46 | 0 | 248 | 0 | 12 | 0 | 12 | 0 | 12 | 0 | 12 |
|   | 1 | 249 | 1 | 13 | 1 | 13 | 1 | 13 | 1 | 13 |
|   | 2 | 250 | 2 | 14 | 2 | 14 | 2 | 14 | 2 | 14 |
|   | 3 | 251 | 3 | 15 | 3 | 15 | 3 | 15 | 3 | 15 |
| 47 | 0 | 252 | 4 | 8 | 4 | 8 | 4 | 8 | 4 | 8 |
|   | 1 | 253 | 5 | 9 | 5 | 9 | 5 | 9 | 5 | 9 |
|   | 2 | 254 | 6 | 10 | 6 | 10 | 6 | 10 | 6 | 10 |
|   | 3 | 255 | 7 | 11 | 7 | 11 | 7 | 11 | 7 | 11 |

Tier Joint

620

| | | | Fim0 | | | | Fim1 | | | |
| | | | Die0 | | Die1 | | Die0 | | Die1 | |
| WL | String | Page | PL0 | PL1 | PL0 | PL1 | PL0 | PL1 | PL0 | PL1 |
|---|---|---|---|---|---|---|---|---|---|---|
| 0 | 0 | 0 | 0 | 12 | 0 | 12 | 0 | 12 | 0 | 12 |
| | 1 | 1 | 1 | 13 | 1 | 13 | 1 | 13 | 1 | 13 |
| | 2 | 2 | 2 | 14 | 2 | 14 | 2 | 14 | 2 | 14 |
| | 3 | 3 | 3 | 15 | 3 | 15 | 3 | 15 | 3 | 15 |
| 1 | 0 | 4 | 4 | 8 | 4 | 8 | 4 | 8 | 4 | 8 |
| | 1 | 5 | 5 | 9 | 5 | 9 | 5 | 9 | 5 | 9 |
| | 2 | 6 | 6 | 10 | 6 | 10 | 6 | 10 | 6 | 10 |
| | 3 | 7 | 7 | 11 | 7 | 11 | 7 | 11 | 7 | 11 |
| 2 | 0 | 8 | 0 | 12 | 0 | 12 | 0 | 12 | 0 | 12 |
| | 1 | 9 | 1 | 13 | 1 | 13 | 1 | 13 | 1 | 13 |
| | 2 | 10 | 2 | 14 | 2 | 14 | 2 | 14 | 2 | 14 |
| | 3 | 11 | 3 | 15 | 3 | 15 | 3 | 15 | 3 | 15 |
| 45 | 0 | 244 | 4 | 8 | 4 | 8 | 4 | 8 | 4 | 8 |
| | 1 | 245 | 5 | 9 | 5 | 9 | 5 | 9 | 5 | 9 |
| | 2 | 246 | 6 | 10 | 6 | 10 | 6 | 10 | 6 | 10 |
| | 3 | 247 | 7 | 11 | 7 | 11 | 7 | 11 | 7 | 11 |
| 46 | 0 | 248 | 0 | 12 | 0 | 12 | 0 | 12 | 0 | 12 |
| | 1 | 249 | 1 | 13 | 1 | 13 | 1 | 13 | 1 | 13 |
| | 2 | 250 | 2 | 14 | 2 | 14 | 2 | 14 | 2 | 14 |
| | 3 | 251 | 3 | 15 | 3 | 15 | 3 | 15 | 3 | 15 |
| 47 | 0 | 252 | 4+12 | 8+0 | 4+12 | 8+0 | 4+12 | 8+0 | 4+12 | 8+0 |
| | 1 | 253 | 5+13 | 9+1 | 5+13 | 9+1 | 5+13 | 9+1 | 5+13 | 9+1 |
| | 2 | 254 | 6+14 | 10+2 | 6+14 | 10+2 | 6+14 | 10+2 | 6+14 | 10+2 |
| | 3 | 255 | 7+15 | 11+3 | 7+15 | 11+3 | 7+15 | 11+3 | 7+15 | 11+3 |
| | | | | | Tier Joint | | | | | |

XOR RECOVERY SCHEMES UTILIZING EXTERNAL MEMORY

BACKGROUND

Field

This disclosure relates to computing devices. More particularly, the disclosure relates to systems and methods for determining parity data for error correction in memory devices.

Description of Related Art

In certain computing systems, such as solid-state data storage systems, hardware limitations of the system may prohibit the use of better XOR recover schemes.

SUMMARY

Because of cost and chip size constraints, the amount of volatile memory that is included in storage devices is limited. This volatile memory can be used for caching, as well as for retaining operations data such as a block placement directory, translation table, parity data, and/or wear leveling data. Due to the limited volatile memory, XOR schemes for calculating parity data are limited in the amount of data they can cache in the volatile memory. While data could be cached in non-volatile memory, schemes that do so typically incur significant performance penalties due to the lower performance of the non-volatile memory compared to the volatile memory. Thus, a solution that increases available high-performance volatile memory without also increasing costs and/or increasing die size would be a beneficial improvement for storage devices.

In some implementations, the present disclosure relates to a storage device comprising a non-volatile memory, volatile memory and a memory controller associated with the non-volatile memory. In response to receiving a request from a host system to store data, the storage device is configured to buffer the data in its volatile memory. The storage device can then obtain XOR parity data corresponding to the buffered data from an external volatile memory within the host system. The storage device can then compute XOR parity data for the buffered data based on the obtained parity data from the external volatile memory and the buffered data. The storage device can then store the computed data back onto the external volatile memory and then write the data from the host system to its non-volatile memory.

By using external volatile memory on the host system, the storage device can make use of the typically larger external volatile memory of the host in various device operations, such as in XOR schemes. While there is a performance penalty to accessing the external volatile memory over the host system's bus, this performance penalty is typically significantly less than the performance penalty in using slower non-volatile memory, resulting in a net performance gain.

By having access to a much larger cache, the storage device is able to utilize more memory intensive processes, such as 2-dimensional (2D) or multi-dimension XOR schemes. These processes can improve storage device performance by providing more robust recovery capabilities, faster XOR accumulation, faster recovery using multiple XOR engines, allowing offloading of the low-density parity-check (LDPC) to the external memory, improving bit flip correction rates, and/or increasing the single-level cell (SLC) block budget by freeing up additional internal memory and thereby improving burst writes. In addition, the internal volatile memory in the storage device can be reduced, leading to cost savings.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

FIG. 6A illustrates a table describing an implementation of a 2-Dimensional (2D) XOR scheme, in accordance with some embodiments.

FIGS. 6B-6E illustrate tables describing implementations of various XOR schemes, in accordance with some embodiments.

DETAILED DESCRIPTION

Figure 1:
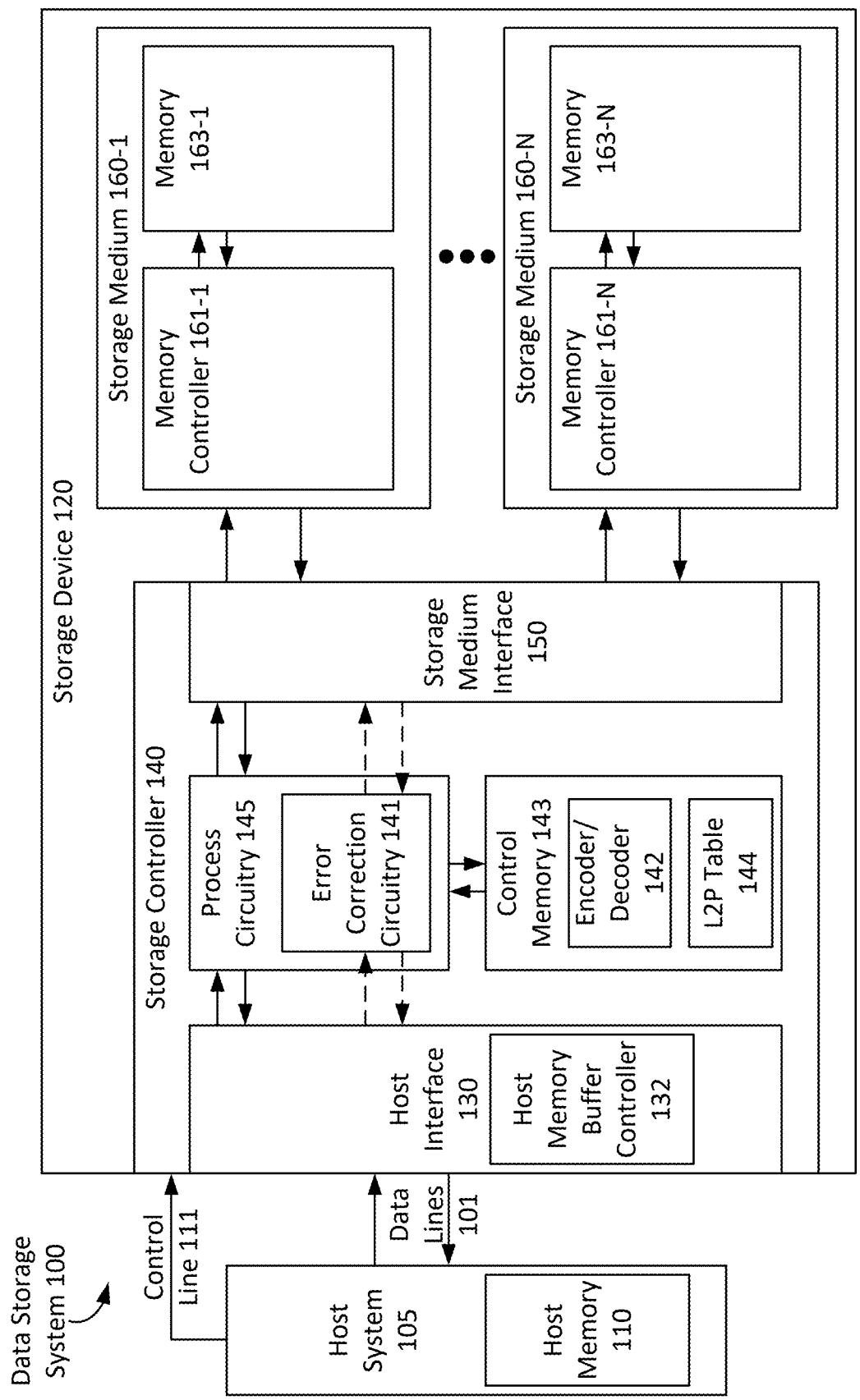
FIG. 1 is a block diagram illustrating an implementation of a data storage system, in accordance with some embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to retrieval of addressing information of memory portions in computing devices, such as solid-state data storage devices.

Overview

In solid-state data storage devices and systems, certain processing operations may be performed by centralized processing circuitry in communication with one or more storage media, and in communication with a host. Solid state drives (SSDs) are typically made up of a number of NAND packages, each with 1-8 NAND dies per package, with each die made of multiple planes, blocks and pages.

A controller in the SSD manages operations of the SSD, including data storage and access as well as communication between the SSD and a host device. Since SSDs employ NAND memory components or other types of non-volatile memory instead of rotating magnetic platters, physical constraints of data retention and recording accuracy differ. Due to the differences in the physical media NAND memory components, as well as the speed and performance differences, error correction mechanisms such as parity functions accommodate these physical media characteristics.

Error correction measures such as parity, checksum and redundancy are present with NAND memory, the typical memory medium of SSDs. Unfortunately, conventional approaches to SSD parity require substantial memory area for operation. A plurality of pages defines a context—the atomic area of memory for which corrupt values are recoverable from other values in the context. However, the entire context is typically stored in an SRAM area reserved for XOR parity operations. SRAM is a type of semiconductor memory that uses bistable latching circuitry to store each bit. The term "static" differentiates it from dynamic RAM (DRAM) which must be periodically refreshed, and SRAM is preferable to DRAM for parity operations due to its speed and addressability. SRAM exhibits data remanence, but it is still volatile in the conventional sense that data is eventually lost when the memory is not powered.

Accordingly, configurations herein substantially overcome the above-described memory demands of conventional parity operations for SSDs by providing access to external volatile memory during memory operations such as XOR parity calculations. In effect, the SSD memory controller can utilize an XOR engine that uses the external volatile memory to allow more memory-intensive XOR operations. With the additional available memory, the XOR engine can use better XOR schemes (e.g., faster, more reliable, have greater throughput, etc.) that require more memory, such as 2D or multi-dimensional XOR schemes.

As used in this application, "non-volatile solid-state memory," "non-volatile memory," "non-volatile memory die", "NVM," "solid-state memory," "solid-state data storage," "semiconductor memory die" or variations thereof may refer to solid-state memory such as NAND flash. However, the systems and methods of this disclosure may also be useful in more conventional hard drives and hybrid drives including both solid-state and hard drive components. In some embodiments, the solid-state memory may be used in a computing device to extend storage capacity of volatile memory such as DRAM. Solid-state memory may comprise a wide variety of technologies, such as flash integrated circuits, Phase Change Memory (PCM, PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), Magnetoresistive RAM (MRAM), or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Solid-State Data Storage

FIG. 1 is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes a storage device 120, such as an SSD or a solid state hybrid drive (SSHD).

The storage device includes a storage controller 140 (sometimes referred to as a storage device controller, storage control circuitry or control circuitry), which may include a host interface 130 with a host memory buffer controller (HMBC) 132, process circuitry 145, storage medium interface 150 and control memory 143 (which may comprise encoder/decoder 142 and logical-to-physical (L2P) table 144). In some embodiments, process circuitry 145 and/or control memory 143 include additional circuitry, modules or data structures not shown in FIG. 1, including but not limited to the ones described with respect to FIG. 2. In some embodiments, process circuitry 145 includes additional circuitry, modules or data structures such as error correction circuitry 141, shown in FIG. 1. Error correction circuitry 141 may represent a subset of circuitry in process circuitry 145 devoted to managing processes related to error correction of one or more storage media (160-1 to 160-N) of storage device 120.

Host or host system 105 may be coupled to storage device 120 through data connections or data lines 101, such as PCI Express, Serial ATA, or non-volatile memory express (NVME). Host system 105 may be a computing device, such as a personal computer, a workstation or a computer server. Host system 105 is sometimes called a computer system. Host system 105 may include one or more processors, one or more types of host memory 110, and a display and/or other user interface components such as a keyboard, a touch screen display, a mouse, a track-pad, a digital camera and/or any number of supplemental devices to add functionality.

Further, in some embodiments, host system 105 sends one or more host commands (e.g., read commands and write commands) on control line 111 to storage device 120, while in other embodiments host system 105 sends host commands to storage device 120 via data connections or data lines 101. In some embodiments, the host system 105 receives data from the storage controller 140. For example, the storage controller 140 may transfer data to the host memory 110 for caching purposes. By using the host memory 110 as a cache or buffer, the storage controller 140 can utilize more memory-intensive processes, even if the control memory 143 is limited in size. In some implementations, host system 105 is a server system, such as a server system in a data center, and does not have a display and other user interface components.

In this non-limiting example, the data storage system 100 is used in conjunction with host system 105. In some embodiments, host interface 130 comprises circuitry and/or components to allow a communication exchange between host system 105 and storage device 120, such as transfer of data to the host memory 110 for caching. Host interface 130 (and HMBC 132) may be included in storage controller 140, as shown in FIG. 1. Alternatively, host interface 130 may be included in storage device 120 but not included in storage controller 140. Host interface 130 may be configured to receive host commands from host system 105, and to respond to host commands by transmitting responses to host system 105. In some embodiments, communications between host system 105 and one or more circuits (e.g., control mapping circuitry 141 and process circuitry 145) of storage controller 140 are facilitated by host interface 130. For example, host commands received at host interface 130 may be forwarded to process circuitry 145. In some embodiments, all host commands received at host interface 130 are first forwarded to process circuitry 145, which may be communicatively coupled to one or more circuits, modules or data structures of storage controller 140.

Storage controller 140 may also include process circuitry 145, which may be configured to perform management tasks of the storage device 120. In some embodiments, all host commands first pass to process circuitry 145, before being transmitted to one or more circuits, components or modules within storage controller 140. In some embodiments, process circuitry 145 may receive and analyze a received host command and generate instructions for one or more circuits, components or modules of storage controller 140 in response to the analysis of the host command. In some embodiments, one or more circuits, components or modules of storage controller 140 may be configured to directly receive a host command from host system 105, as depicted by the dotted lines of communication between host interface 130 and control mapping circuitry 141. Process circuitry 145 may include or may be coupled to one or more processing units (also sometimes called CPUs, processors, hardware processors, microprocessors or microcontrollers) configured to execute instructions in one or more programs. Process circuitry 145 may include circuitry, processes and/or mechanisms for management of memory 163 in each respective storage medium 160, such as, but not limited to, a flash translation layer (FTL).

In some embodiments, storage controller 140 includes control memory 143. Control memory 143 may be electrically and/or communicatively coupled to one or more circuits, components or modules within storage controller 140, such as process circuitry 145. In some embodiments, control memory 143 is configured to store information for the one or more coupled circuits, components or modules. Control memory 143 may further include circuitry, components, data structures or modules such as encoder/decoder 142 and logical-to-physical table 144. In some embodiments, encoder/decoder 142 is configured to decode addressing information corresponding to memory in a storage medium 160. For example, a physical address of a page (or other unit) of memory may be determined by de-multiplexing addressing information corresponding to the page, using decoder 142. Logical-to-physical table 144 may be configured to store logical addresses with corresponding physical addresses of stored information in one or more storage media 160 of storage device 120.

The term "control circuitry" is used herein according to its broad and ordinary meaning, and may refer to any circuitry, module, device or component of the non-volatile storage device 120 configured to perform any of the functional aspects of the present disclosure. For example, one or any combination of the storage controller 140 (e.g., control circuitry or storage device control circuitry), the host interface 130, the process circuitry 145, the control mapping circuitry 141, the control memory 143, the decoder 142, the logical-to-physical table 144, and/or the storage medium interface 150 can be referred to as "control circuitry." The control circuitry (including storage controller 140) of the non-volatile storage device 120 may provide a means for providing addressing information of a portion of memory in one or more storage media 160 in accordance with aspects of the present disclosure.

Storage medium interface 150 of storage controller 140 may be configured to facilitate transfer of information, such as instructions, commands, control signals and data, between storage controller 140 and one or more storage media 160. In some embodiments, storage medium interface 150 comprises circuitry and/or components to allow a communication exchange between storage controller 140 and a respective storage medium 160. Storage medium interface 150 may be included in storage controller 140, as shown in FIG. 1. Alternatively, storage medium interface 150 may be included in storage device 120 but not included in storage controller 140.

Data storage system 100 may also include one or more storage media 160 (e.g., a storage medium 160-1 to storage medium 160-N depicted in FIG. 1). In some embodiments, a respective storage medium 160 may be a semiconductor die, or memory module comprising multiple die. In some embodiments, each storage medium 160 includes memory controller 161 (sometimes referred to as a memory die controller or storage control circuitry), and memory 163. Memory controller 161 may include particular circuits, modules or data structures such as, but not limited to, storage mapping circuitry 162. In some implementations, memory controller 161 includes one or more processing units (also sometimes called CPUs, processors, hardware processors, microprocessors or microcontrollers) configured to execute instructions in one or more programs. In some embodiments, memory 163 of a respective storage medium 160 is coupled to memory controller 161 through connections that typically convey commands in addition to data, and optionally convey metadata, error correction information and/or other information in addition to data values to be stored in memory 163 and data values read from memory 163. Storage medium 160 and/or memory 163 may be configured for enterprise storage suitable for applications such as cloud computing, or for caching data stored in secondary storage, such as hard disk drives. Additionally and/or alternatively, storage medium 160 and/or memory 163 may also be configured for relatively smaller-scale applications such as personal flash drives or hard-disk replacements for personal, laptop and tablet computers. Although flash memory devices and flash controllers are used as an example here, storage device 120 may include any other non-volatile memory device(s) and corresponding non-volatile memory control circuitry.

The term "storage control circuitry" is used herein according to its broad and ordinary meaning, and may refer to any circuitry, module, device or component of the non-volatile storage medium 160 configured to perform any of the functional aspects of the present disclosure. The storage control circuitry (including memory controller 161) of the non-volatile storage medium 160 may provide a means for providing addressing information of a portion of memory in storage medium 160 in accordance with aspects of the present disclosure.

Figure 3:
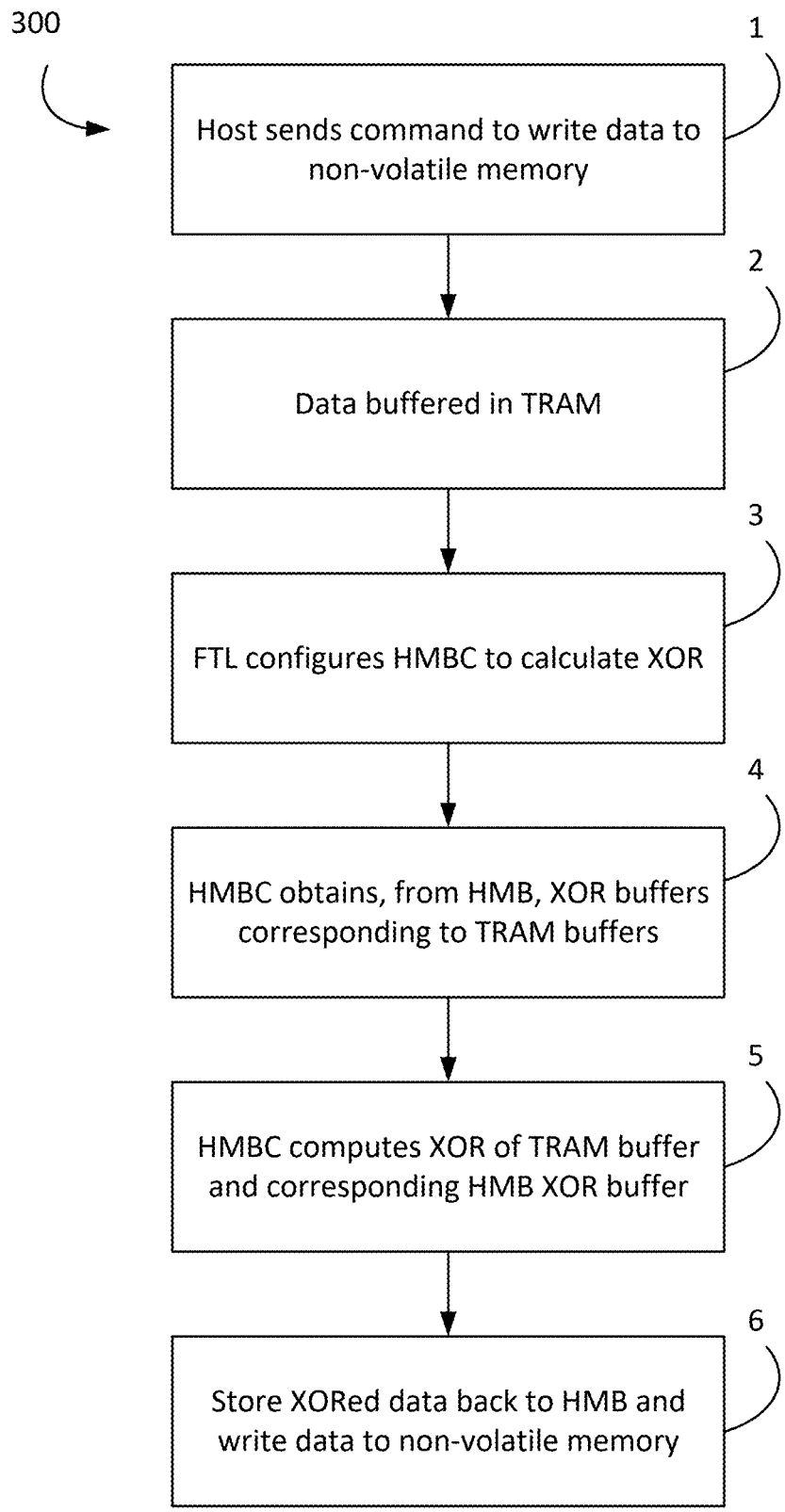
FIG. 3 is a flow diagram illustrating a process for performing an XOR operation using external non-volatile memory, in accordance with some embodiments.

Memory 163 may include particular circuits, modules or data structures such as, but not limited to, physical-to-logical (P2L) table 164, or others described with respect to FIG. 3. In some implementations, memory 163 of storage medium 160 includes NAND-type flash memory or NOR-type flash memory. Further, in some implementations, memory controller 161 comprises a solid-state drive (SSD) controller. However, one or more other types of storage media may be included in accordance with aspects of a wide variety of implementations. In some embodiments, the physical-to-logical (P2L) table 164 is maintained in the memory controller 161.

Memory cells of memory 163 of each storage medium 160 of FIG. 1 may be arranged according to a NAND flash memory structure. A solid-state memory array, such as a NAND flash array, may include memory cell units, also referred to as "NAND strings," or "memory strings," each unit comprising a memory cell group that includes a plurality of serially-connected solid-state storage elements, or memory elements. "Solid-state storage elements," "memory elements" or "data storage cells," may comprise memory cell transistors. The terms "solid-state storage element," "memory element" and "data storage cell" are used herein according to their broad and ordinary meaning, and may refer to any device, transistor, cell, unit, or plurality or combination of the same, configured to exhibit a particular electrical or magnetic or electromagnetic characteristic, which characteristic represents a value representative of data, as described herein.

In some embodiments, memory 163 of storage media 160 includes non-volatile memory, such as flash memory. Such non-volatile memory may not be configured to update the contents of used portions (e.g., blocks) or sub-portions (e.g., pages or sub-pages) of the non-volatile memory without first erasing the used portions. As such, garbage collection is a technique that may allow storage device 120 to efficiently re-distribute used portions or sub-portions of memory to provide more available storage space in contiguous portions or sub-portions of unused memory.

In some embodiments, memory 163 of each storage medium 160 is divided into a number of addressable and individually selectable blocks. In some implementations, the individually selectable blocks, sometimes called erase blocks, are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), however, the smallest individually accessible unit of memory set can be a sub-page, which is a subunit of a page. That is, a block includes a plurality of pages, each page contains a plurality of sub-pages, and each sub-page is the smallest unit of memory for reading data from the flash memory device. For example, each block includes any number of pages, for example, 64 pages, 128 pages, 256 pages or another suitable number of pages. In another example, each block includes any number of sectors, for example, 64 sub-pages, 128 sub-pages, 256 sub-pages or another suitable number of sub-pages.

Memory 163 may be arranged as a two-dimensional (2D) memory array, or a three-dimensional (3D) array. In contrast to 2D memory arrays, which are generally formed along a planar surface of a semiconductor wafer, 3D arrays can generally extend up from the wafer surface and generally include stacks, or columns, of memory cells extending upwards (i.e., orthogonal to the wafer surface). Various 3D arrangements/architectures are possible.

FIG. 1 illustrates a non-volatile storage device 120 that may include one or more storage media 160 which may each include memory die or chips. Such die/chip(s) and/or memory controller 161, may be mounted or otherwise connected to one or more controller boards, such as printed circuit boards (PCBs) having certain circuitry, die/chips and/or discrete components mounted or otherwise connected thereto, for providing control functionality for the system. The term "board" is used herein according to its broad and ordinary meaning, and may refer to any type of board or substrate on which one or more chips or devices may be mounted. The memory 163 of storage medium 160 may include an array (two-dimensional or three dimensional) of solid-state memory cells. The memory cells may have a 3D memory (e.g., 3D NAND) configuration, or a 2D memory configuration.

In certain embodiments, the storage controller 140 and/or other control circuitry of the non-volatile storage device 120 (e.g., memory controller 161) may comprise hardware, firmware, or a combination of hardware and software or firmware. For example, storage controller 140 may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, storage controller 140 may comprise instructions executable with a processor or processor circuitry to implement one or more of the features of the storage controller 140. The storage controller 140 (which may be a flash memory device controller in certain embodiments) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller.

Storage Controller

Figure 2:
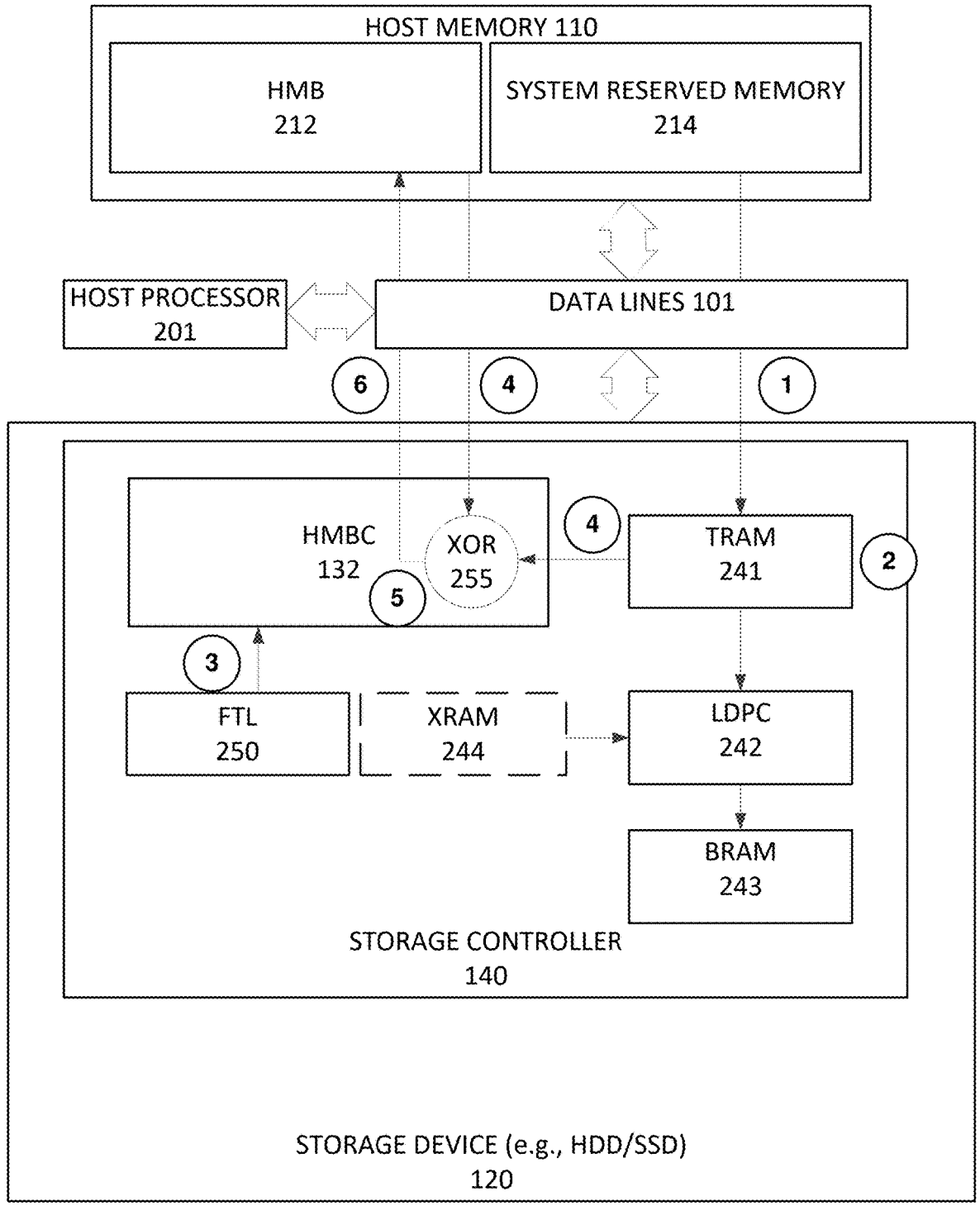
FIG. 2 is a block diagram illustrating an implementation of a storage controller of a storage device, in accordance with some embodiments.

FIG. 2 is a block diagram illustrating an implementation of a storage controller 140 of FIG. 1, according to embodiments of the data storage system 100. A host processor 202 is in communication with, over data lines 101 such as a host bus, with a storage device 120. In turn, the storage device 120 is in communication with a host memory 110 over the data lines 101. A portion of the host memory may be set aside as a host memory buffer (HMB) 212 for use by the storage device 120. Another portion of the host memory may be set aside as system reserved memory 214 for use by the host system for various processes, such as for the operating system or for use by various software programs.

As discussed in FIG. 1, the storage controller 140 of the storage device 120 can handle various memory operations. In particular, the storage controller 140 can handle error correction using error-correcting codes, including performing XOR operations.

XOR or "exclusive OR" is a reliability enhancement that can increase the reliability of NAND components. The XOR scheme is named after the Boolean logical function and allows replacement of up to an entire defective NAND die in a component through XOR operations. The XOR scheme can provide protection against die failure and extrinsic Uncorrectable Bit Error Rate (UBER) evens by replacing entire or defective portions of a NAND die array utilizing spare NAND die array that be built with reconstructed data via the XOR parity data bits.

The XOR scheme's primary goal in an SSD is to reduce any catastrophic data loss failure and average failure rate. This is accomplished using the Boolean XOR logical function that A XOR B XOR B=A. The XOR-ing of incoming data packets from the host generates XOR parity bits that later can be used to rebuilt data if needed. By storing the result of A XOR B as parity data, the scheme allows A or B to be recreated by XORing the parity data with A (to recreate B) or B (to recreate A).

In one embodiment, in order to overcome certain failures like a wordline to wordline short, an XOR based system wide solution is used. When a write is performed via the storage controller 140 to the flash, the write is processed by an XOR engine 255 in the storage controller 140. In one implementation, the XOR engine 255 is part of the LDPC (low density parity check) controller which encodes the data and generates parity information. Host data can be written to TRAM 241 and XOR data can be computed with help of XRAM 244 or the HMB 212.

The storage controller 140 control circuitry can include a host memory buffer controller (HMBC) 132 to initiate and coordinate data transfers from the storage controller to the host memory 110. The HMBC can enable access to the HMB 212 portion of the memory in the host reserved for the storage device 120 in an efficient way. The storage device can use the HMB 212 to store its transient buffers and data structures. The data in the external volatile memory may be encrypted and protected by cyclic redundancy checks (CRC) and error correction codes (ECC). In an embodiment, the protection mechanism is implemented by the hardware and is transparent to the firmware.

In one possible implementation, the HMBC supports up to eight HMB fragments for the data and a single contiguous buffer for the metadata. The granularity of the HMB 212 can be implemented in data chunks of 128 bytes. Each 128 bytes can be protected by firmware tag, CRC and ECC which are stored in a separate metadata buffer from the parity data in HMB 212.

The storage controller 140 can also include internal volatile memory located in the storage device 120 as control memory 143. A flash-based SSD typically uses a small amount of DRAM as a volatile cache, similar to the buffers in hard disk drives. A directory of block placement and wear leveling data can also be kept in the cache while the drive is operating. In some embodiments, the control memory 143 is partitioned into chunks for specific uses, such as a transfer RAM (TRAM) 241, buffer RAM (BRAM) 243, and XOR RAM (XRAM) 244. In some embodiments, the XOR RAM may be eliminated completely if XOR operations are performed on the host memory 110. The storage controller 140 can also include a file translation layer (FTL) 250 to handle translation from Logical Block Addresses (LBA) from the host to Physical Block Addresses (PBA) on the drive as well as garbage collection.

In some embodiments, the FTL 250 is implemented as 8 open blocks. Of the 8 blocks, 4 triple-level cell flash (TLC) open blocks are for hosting sequential/random data and for static/dynamic relocation. The other 4 blocks are 4 single level cell (SLC) open blocks for hosting sequential/random data, control blocks and for blind relocation.

In a storage device 120 such as an SSD, an XOR stripe size is the number of pages that need to be XORed together to generate the parity data. An XOR context defines a page of XOR-accumulated data for a given stripe. The XOR mechanism protects the SSD from NAND die level failures, NAND programming failures and uncorrectable errors from the NAND-MEDIA-ECC protection. In applying the parity operation, a predetermined number of NAND pages are XORed together to generate parity data for the XOR stripe, and the XOR data is written to the media. In case of a failure, the parity data (in combination with the rest of the data from the stripe, excluding the failed page) is used to restore data on an unrecoverable NAND page or die.

FIG. 3 is a flow diagram illustrating a process 300 for calculating XOR parity data, in accordance with one or more embodiments of the data storage system 100. Process 300 may be performed, for example, by control circuitry of a storage medium, such as the storage controller 140 of a storage device 120, as described herein. By utilizing the host's larger external volatile memory 110 to supplement or replace the storage device's internal volatile memory, the storage device 120 is able to use better XOR algorithms by alleviating memory constraints. For ease of explanation, the data flow of the process 300 is indicated in FIG. 2, with labels in FIG. 2 corresponding to the blocks of FIG. 3.

Starting at block 1, the host sends a write command to the storage device 120. For example, data cached on the host memory 110 may have been updated and the host processor 201 is directing the host memory 110 to transfer the updated data ("write data") to the storage device 120 to be written back to permanent storage on the storage media of the storage device 120.

At block 2, the storage controller 140 receives the write data and buffers it into the TRAM, which may be a portion of volatile memory (e.g., DRAM) in the storage device 120. For example, the write data may be cached in the system reserved memory 214 portion of the host memory 110. The write data is then transferred over the data lines 101 to the storage device 120 for buffering on the TRAM.

At block 3, the FTL 250 directs the HMBC to calculate the XOR parity data. The HMBC manages the storage of parity data on the external host memory 110. In some embodiments, all the parity data may be stored on the host memory 110. In other embodiments, a first portion of the parity data may be stored in the host memory 110 while a second portion is stored in internal volatile memory (e.g., in XRAM 244).

The first portion and the second portion of parity data may be different from each other or at least partially overlap. For example, the limited size XRAM 244 may cache only the most used parity data using any of various caching algorithms such as first in, first out (FIFO), most recently used (MRU), etc. As the XRAM 244 will typically be faster to access than the host memory 110, there is some benefit in performance to keeping the most used parity data on the storage device 120. In other embodiments, the first portion in the host memory 110 may be overflow storage, which is used once there is no more available space in the internal volatile memory.

In some embodiments, all the parity data may be stored in the HMB 212 portion of the host memory 110. This allows the XRAM 244 to be eliminated, reducing the hardware costs of the storage device 120. The storage device 120 may still have some non-volatile memory for other uses, such as for TRAM 241 or BRAM 243.

At block 4, the HMBC brings in the XOR buffers corresponding to the data buffered in the TRAM. During the course of memory operations, the storage device 120 can calculate parity data for various data pages and store that parity data on the HMB 212. For example, the buffered data stored on the TRAM may have corresponding parity data stored on the HMB 212. The HMBC 132 can identify the buffered data (e.g., using page identifiers), locate the corresponding parity data (e.g., by matching to the page identifiers), and transfer the corresponding XOR parity data to the TRAM.

At block 5, the HMBC computes XOR data of the TRAM buffer and the corresponding HMB XOR buffer. In an example transaction, assume page 1 (P1) is a page stored on the storage media of the storage device 120. At some point, P1 has been temporarily cached in the host memory 110 and modified, creating PX1. This PX1 page then needs to be written to the storage device 120. Prior to writing the data to the storage medium, PX1 has been brought into the TRAM buffer as well as the corresponding parity data PD1. For example, in a 1-dimensional XOR scheme, PD1 can comprise of all pages from a particular plane as PX1. The HMBC can then perform the calculation PD1 XOR PX1=PDX1, wherein PDX1 is the parity data for PX1. In some embodiments, more complex XOR calculations can be performed to generate parity data according a selected error correction code (e.g., Hamming codes, Reed-Solomon codes, cyclic redundancy check (CRC), etc.).

At block 6, the storage device 120 stores the XOR parity data back to the HMB 212 and writes the buffered data to non-volatile memory. Referring back to the prior example, PX1 is written to non-volatile memory on the storage device 120 and PDX1 is transferred over the data lines 101 for storage on HMB 212 on the host memory 110. In some embodiments where XRAM 244 is retained, the storage device 120 can determine whether to store the XOR parity data on the HMB 212 or on XRAM 244. For example, the storage device 120 may determine that the XOR parity data corresponds to data that is likely to be read often (e.g., using various caching algorithms) and stores the parity data locally on internal XRAM 244.

In some embodiments, the parity data stored in HMB 212 is written back to non-volatile memory of the storage device 120 in certain situations. This ensures that the parity data remains consistent with the data stored on the storage medium of the storage device 120. For example, during computer shutdown the parity data may be copied back. The data may also be copied back periodically or after a certain number of write transactions. The data may also be copied back asynchronously, during less busy times of the storage device 120. In one embodiment, the XOR parity data may always be copied back whenever updated, with the parity data updates being written both to the external volatile memory and the internal non-volatile memory at the same time.

Figure 4:
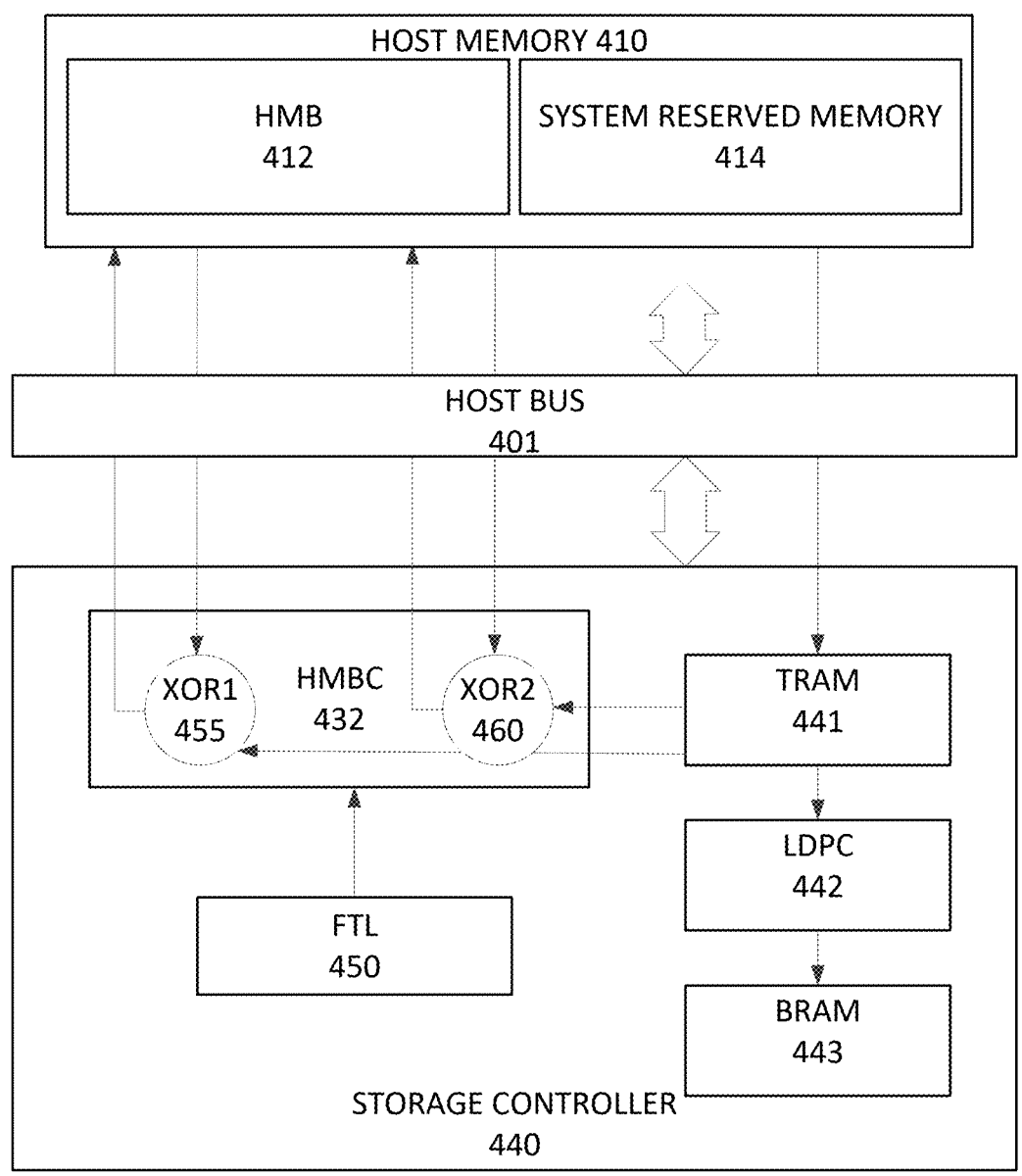
FIG. 4 is a block diagram illustrating an implementation of a storage controller of a storage device configured to use multiple XOR engines, in accordance with some embodiments.

FIG. 4 is a block diagram illustrating an implementation of a data storage system 400. The data storage system 400 comprises a storage controller 440 similar to the storage controller 140 of FIGS. 1 and 2, but implements multiple XOR engines: XOR1 455 and XOR2 460.

A host memory 410 comprising an HMB 412 and a system reserved memory portion 414 is in communication with, over data lines such as a host bus 401, with a storage controller 440 for a storage device (not shown). The storage controller 440 control circuitry can include a host memory buffer controller (HMBC) 432 to initiate and coordinate data transfers from the storage controller to the host memory 410. The storage controller 440 can also include internal volatile memory located in the storage device. A flash-based SSD typically uses a small amount of DRAM as a volatile cache, similar to the buffers in hard disk drives. A directory of block placement and wear leveling data can also be kept in the cache while the drive is operating. In some embodiments, the volatile memory is partitioned into chunks for specific uses, such as a TRAM 441, BRAM 443, and optional XRAM (not shown). The storage controller 440 can also include a file translation layer (FTL) 450 to handle translation from Logical Block Addresses (LBA) from the host to Physical Block Addresses (PBA) on the drive as well as garbage collection.

The HMBC 432 can utilize multiple XOR engines in order to speed up processing. For example, XOR accumulation can be performed faster when calculating parity data. Also, the recovery process can also be performed faster as the lost data can be recreated faster from the parity data. In the embodiment shown in FIG. 4, the HMBC 432 is shown with two XOR engines, XOR1 455 and XOR2 460. The XOR engines can receive buffered/cached data from the TRAM 441 and/or HMB 412, calculate parity data, and then store the parity data on the HMB 412. In other embodiments, more than two XOR engines can be used to further speed up processing.

Figure 5:
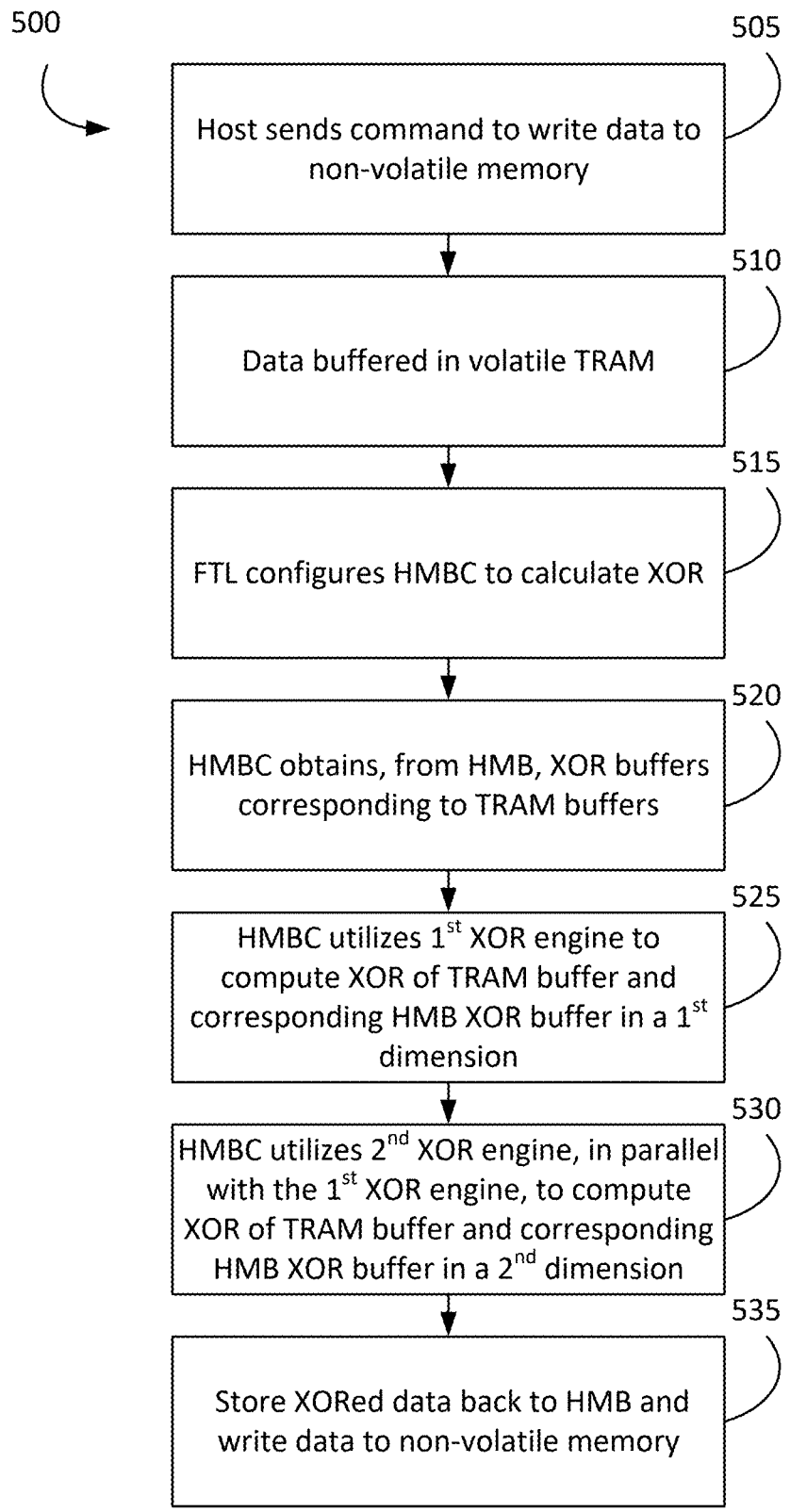
FIG. 5 is a flow diagram illustrating a process for performing an XOR operation using multiple XOR engines, in accordance with some embodiments.

FIG. 5 is a flow diagram illustrating a process 500 for calculating XOR parity data, in accordance with one or more embodiments. Process 500 may be performed, for example, by control circuitry of a storage medium, such as the storage controller 440 of a storage device, as described herein. By utilizing multiple XOR engines, performance can be increased. For ease of explanation, FIG. 5 is described in reference to the components of FIG. 4, however, other embodiments of the storage device can utilize this process 500.

Starting at block 505, the host sends a write command to the storage controller. For example, data stored on the host memory 410 may have been updated and the host is directing the host memory 410 to transfer the updated data ("write data") to the storage device to be written back to the storage media of the storage device 120.

At block 510 the storage controller receives the write data and buffers it into the volatile TRAM, which may be a portion of volatile memory in the storage controller such as DRAM. For example, the write data may be cached in the system reserved memory 414 portion of the host memory 410. The write data is then transferred over the host bus 402 to the storage device 420.

At block 515, the FTL 450 directs the HMBC to calculate the XOR parity data. The HMBC manages the storage of parity data on the external host memory 410. In some embodiments, all the parity data may be stored on the host memory 410. In other embodiments, a first portion of the parity data may be stored in the host memory 410 while a second portion is stored in internal volatile memory (e.g., XRAM 444).

The first portion and the second portion of parity data may be different from each other or at least partially overlap. For example, the limited XRAM 444 may cache only the most used parity data using any of various caching algorithms such as first in, first out (FIFO), most recently used (MRU), etc. As the XRAM 444 will typically be faster to access than the host memory 410, there is some benefit in performance to keeping the most used parity data on the storage device.

In some embodiments, all the parity data may be stored in the HMB 412 portion of the host memory 410. This allows the XRAM 444 to be eliminated, reducing the hardware costs of the storage device. The storage device may still have some non-volatile memory for other uses, such as for TRAM 441 or BRAM 443.

At block 520, the HMBC brings in the XOR buffers corresponding to the data buffered in the TRAM. During the course of memory operations, the storage device can calculate parity data for various data pages and store that parity data on the HMB 412. For example, the buffered data stored on the TRAM may have corresponding parity data stored on the HMB 412. The HMBC 432 can identify the buffered data (e.g., using page identifiers), locate the corresponding parity data (e.g., by matching to the page identifiers), and transfer the corresponding XOR parity data to the TRAM.

At block 525, the HMBC utilizes the $1^{st}$ XOR engine 455 to compute XOR of the data in the TRAM buffer and the corresponding HMB XOR buffer in a $1^{st}$ dimension. At block 530, the HMBC utilizes the 2nd XOR engine 460 to compute XOR of the data in the TRAM buffer and the corresponding HMB XOR buffer in a 2nd dimension. FIG. 6a illustrates one possible scheme for calculating the XOR in a $1^{st}$ dimension and a $2^{nd}$ dimension. In one embodiment, the $1^{st}$ XOR engine 455 and the $2^{nd}$ XOR engine 460 operate in parallel or at least partially in parallel in order to increase processing speeds for parity calculations.

In an example transaction, assume PX1 is the data in TRAM and PD1 and PD2 are corresponding parity data in the $1^{st}$ and $2^{nd}$ dimension, respectively. For example, PD1 can comprise of the same numbered plane page of each plane and die as PX1 and PD2 can comprise of all pages from a particular plane as PX1, as described in further detail in FIG. 6a. The HMBC can then perform the calculation PD1 XOR PX1=PDX1, wherein PDX1 is the parity data for PX1 in the $1^{st}$ dimension. The HMBC can then perform the calculation PD2 XOR PX1=PDX2, wherein PDX2 is the parity data for PX1 in the $2^{nd}$ dimension. In some embodiments, more complex XOR calculations can be performed to generate parity data according a selected error correction code (e.g., Hamming codes, Reed-Solomon codes, cyclic redundancy check (CRC), etc.) to calculate PDX1 and PDX2.

At block 535, the storage device stores the XOR parity data back to the HMB 212 and writes the buffered data to non-volatile memory. Referring back to the prior example, PX1 is written to non-volatile memory on the storage device and PDX1 and PDX2 are transferred over the host bus 402 for storage on HMB 412 on the host memory 410.

FIG. 6A illustrates a table 600 describing an implementation of a 2D XOR scheme, in accordance with some embodiments. Starting from the top left, the table shows worldline (WL) 0 and WL 1, each with Strings 0-3 and Page 0-3. Starting from the top, the table shows flash interface manager (FIM) 0 and FIM1, each with a Die0. Each Die0 then has Planes 0-3.

The table show two sets of parities calculated. X0, X1 . . . X7 are calculated from the data written to the same plane page of each Plane and Die. For example, X0 is calculated from all the plane pages marked by 0 as shown in FIG. 6A. For FIM0, Die0, PL0, page 0 is the $1^{st}$ page in the column. In column PL1, page 0 is the 5 page down in the column. In column PL2, page 0 is the last page in the column. In column Pl3, page 0 is the $4^{th}$ page down in the column. For FIM1, Die0: PL0: $7^{th}$ page down; PL1: $3^{rd}$ page down; PL2: $6^{th}$ page down; and PL3: $2^{nd}$ page down. Similarly, X1 is calculated from all the plane pages marked by 1 in FIG. 6A and so on for X2-X7.

Y0, Y1 . . . Y7 are calculated from the data written to all the pages from a particular Plane. For instance, all the pages (0-7) written to PL0 of Die0, FIM0 (represented in the table by the column over Y0), is used for calculating Y0. Similarly, Y1 is calculated using all the pages (0-7) written to PL1 of Die0, FIM0 (represented in the table by the column over Y1) and so on for Y2-Y7.

A 2D XOR scheme enables recovery even if more than one plane page corresponding to the same bin fails at the same time. This is not possible using a 1D XOR scheme. For instance, assume a Plane page corresponding to Bin 7 failed on both FIM0, Die 0, WL1, PL0, Page 7 and FIM1, Die 0, WL0, PL1, Page 1. It would be possible to recover FIM0, Die 0, WL1, PL0, Page 7 using Y0. Then it would also be possible to recover FIM1, Die 0, WL0 PL1, Page 1 using X7.

In addition, since there are less memory constraints, there can be more open blocks supported, allowing data to be written to open blocks. If there were fewer open blocks, there would be more swapping of the data in the volatile memory, leading to lower performance. XRAM swapping is used when there is limited XOR RAM available for the storage device, but incurs a performance cost.

FIGS. 6B-6C illustrate other XOR schemes that utilize more XRAM in exchange for better recovery capabilities from NAND errors. These schemes may use double the XRAM compared to standard XOR schemes (e.g., single-dimensional XOR schemes). For example, for an XOR bin that generally uses 16K of XRAM and assuming a 16 bin XOR scheme, the FIG. 6b scheme would use 512K (16K*16*2) compared to 256K (16K*16) of a standard XOR scheme. However, when combined with the external volatile memory technology described above, the additional XRAM requirements can be met with external volatile memory. The physical XRAM memory requirements on the storage device can remain small, with virtual XRAM memory provided by the physical external memory of the host.

FIG. 6B illustrates a table 605 describing an implementation of another XOR scheme, in accordance with some embodiments. In FIG. 6B, the pages are accumulated in FIM-wise order. XOR bins are accumulated and dumped in the last logical worldline (LWL) of a metablock. Accumulation is done across the entire metablock. While writing the XOR parity data in the last LWL, a copy is written in each of the FIM's last LWL. As shown in FIG. 6B, the XOR parity data in wordline 47 is calculated for both FIM0 and FIM1. As can be seen in this embodiment, the same pattern of bins are used to calculate the parity data, but depending on the contents of the bin, the calculated value can be different. For example, the first bin in LWL 47, FIM0 is shown as "4," which is accumulated from all the other bins labeled "4" in wordline (WL) 1-46, FIM0. Similarly, the first bin in LWL 47, FIM1 is shown as "4" and is accumulated from all the other labeled marked "4" in WL 1-46, FIM1. However, the bins labeled "4" can contain different values in different WLs and can also be different across flash interface managers (FIMs).

FIG. 6C illustrates a table 610 describing an implementation of another XOR scheme, in accordance with some embodiments. In FIG. 6C, the pages are accumulated in FIM-wise order with dual XORs. For example, in the row WL 47, String 2, Page 254, FIM0: bins 6 and 12 and XORed together, bins 10 and 0 are XORed together, bins 2 and 8 are XORed together, and bins 14 and 4 are XORed together. The accumulated bins are XORed among themselves to halve the number of bins. This has the advantage of using less physical blocks for storing parity information in comparison to FIG. 6B. As shown in FIG. 6C, the XOR parity data in wordline 47 is accumulated using the same pattern of bins in both FIM0 and FIM1. However, the bins can contain different values across the FIMs.

FIG. 6D illustrates a table 615 describing an implementation of another XOR scheme, in accordance with some embodiments. In FIG. 6D, the pages are accumulated in die wise order. As parity data is calculated per die, more XRAM is needed. For example, for a 4 die memory, XRAM requirements are 4 times more than a standard XOR scheme or 1024K (16K*16*4) for XOR bins that need 16K each of XRAM for parity data. Thus, 4 separate sets of parity data (bins 0-15) are stored for each Die (Die0-Die3) in WL 46 and 47.

Figure 6E:

FIG. 6E illustrates a table 620 describing an implementation of another XOR scheme, in accordance with some embodiments. In FIG. 6E, the pages are accumulated in die wise order, similar to FIG. 6D. However, unlike FIG. 6D, the accumulated bins are XORed (e.g. using dual XOR) among themselves to halve the number of bins. This has the advantage of using less physical blocks for storing parity information in comparison to FIG. 6D.

While the above described using 2 XOR engines and the 2D XOR scheme described in FIGS. 6A-6E, these are not the only possibilities. For example, 3 or more XOR engines can be used. In another example, a single XOR engine can be used to calculate the parity data in the $1^{st}$ dimension and then in the $2^{nd}$ dimension. In addition, other multi-dimensional XOR schemes can be used. For example, different pages can be selected for generating the parity data. Furthermore, parity data can be generated in more than 2 dimensions.

The above XOR schemes can allow the storage device to recover from different types of errors. In particular, some of the schemes allow recovery from additional error types. As different errors may be correctable using different sized error correction memory, a controller may identify errors in the regions of memory in a non-volatile memory array. FIGS. 7A-7E are multiple block diagrams that show different types of failures that may occur in different regions of a non-volatile memory like memory array. Metablock-wise accumulation with, for example, a 24 bin XOR recovery scheme can allow recovery on NAND errors shown in FIGS. 7A-7B. Meanwhile, FIM-wise or die-wise accumulation can be used to recover from NAND errors shown in FIGS. 7C-7E.

Figure 7A:
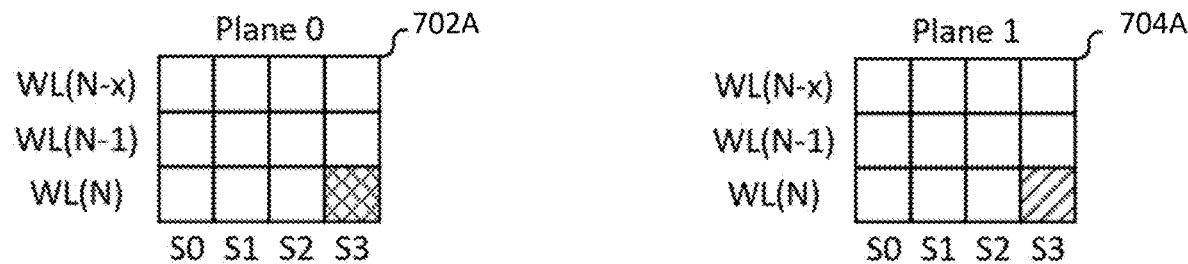
FIG. 7A-7E illustrate block diagrams representing different types of correctable failures that may occur in different regions of a non-volatile memory, in accordance with some embodiments.

FIG. 7A illustrates a memory failure where a short exists between strings on neighboring planes on a die of memory. As illustrated, a die may include two or more planes of memory, including a first plane 702A and a second plane 704A. In the depicted embodiment, a memory failure is due to cells associated with word line N and string 3 (S3) on both the first plane 702A and the second plane 704A being shorted together. As illustrated, the hatching pattern is different for the first plane 702A and the second plane 704A. In the first plane, the error associated with word line N and string S3 may be experiencing both a program status failure and either an uncorrectable error code correction failure or a short. In the second plane, word line N and string S3 has a different hatching pattern and may be experiencing an uncorrectable error code correction failure or a short.

Figure 7B:
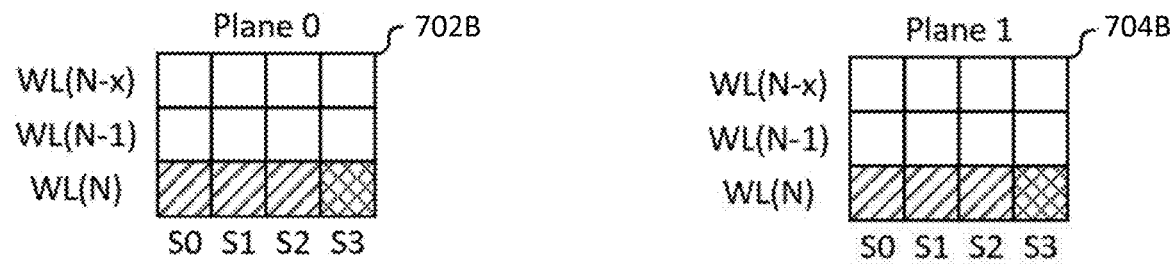

In another example of memory failure, FIG. 7B illustrates a memory failure where word lines on neighboring planes are shorted. As discussed above, a die may include a first plane 702B and a second plane 704B. In this exemplary failure, word line N on both the first plane 702B in the second plane 704B may be shorted together. Further, the cell on word line N and string S3 may be experiencing a program status failure as shown by the different hatching pattern.

Figure 7C:
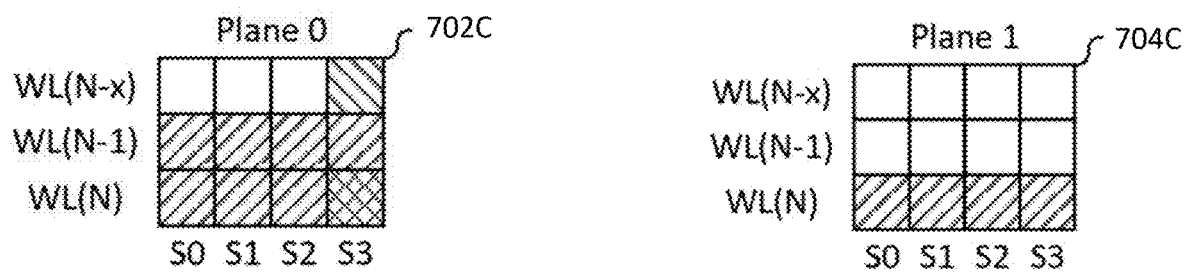

In a further example, FIG. 7C illustrates a memory failure when neighboring word lines fail during programming. For example, two neighboring word lines, word lines N and N-1, on the first plane 702C and word lines N on the second plane 704C may fail during programming as the word lines N on the first planes and word lines N-1 on the first plane experience uncorrectable error code correction failure. Further, word line N and string S3 and both the first plane 702C and second plane 704C may experience a program status failure as represented by the different hatching pattern. Also, word line N-2 and string S3 may experience a possible uncorrectable error code correction failure as shown by the different hatching pattern.

Figure 7D:
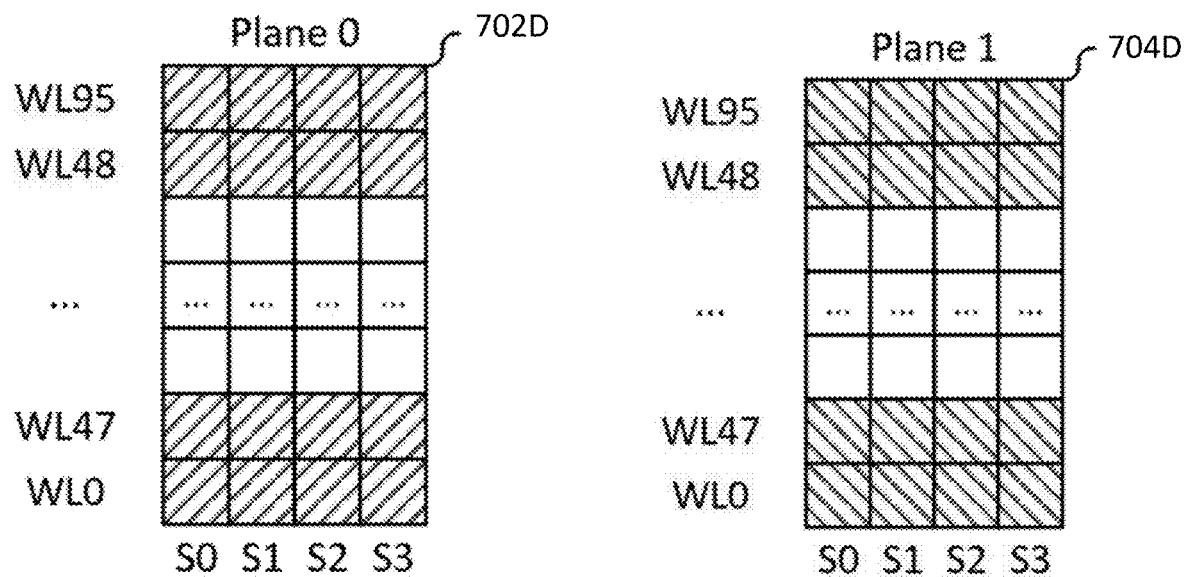

FIG. 7D illustrates a memory failure when a word line on the edge of the plane fails during a read. As shown, in this example, word lines on the edge of a plane may experience a failure during a read. As shown, word lines 0, 47, 48, and 95 on both planes 702D and 704D may be located on the edge of a die on separate tiers of a memory element as they experience a failure. Accordingly, word lines 0, 47, 48, and 95 on plane 0 may experience an uncorrectable error code correction failure and word lines 0, 47, 48, and 95 on plane 1 may experience a possible uncorrectable error code correction failure as shown by the different hatching pattern.

Figure 7E:
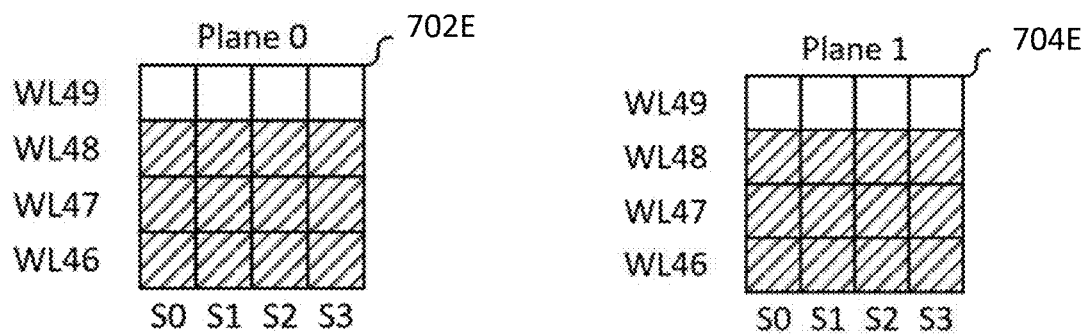

FIG. 7E illustrates a memory failure when an edge word line around a joint fails during a read. For example, word lines 46-48 may be located around a joint that joins the two-tier memory holes etched in the NAND flash memory.

As shown, word lines 46-48 on plane 0 and plane 1 may experience uncorrectable error code correction failures. The storage controller 140 may be able to identify an error such as the errors discussed above with regards to FIGS. 7A-7E. As used herein, to identify an error may refer to identifying that an error has occurred and identifying operational parameters associated with the memory experiencing the error.

As shown, in FIGS. 7A-7E, different memory locations on a die of memory may be susceptible to different types of memory failures. Also, different amounts of data may be used to recover from different errors that occur based on the location and type of the error that occurs on a die. For example, a failure of the type illustrated in FIG. 7A may be correctable using an associated XRAM that is 24 times a plane page size. Conversely, other types of failures that occur at other locations on the die may be correctable using an associated XRAM that is 48 times a plane page size. By using the external volatile memory technology discussed above, virtual XRAM can be allocated on the external volatile memory of the host to provide the additional XRAM capacity needed to utilize the more memory intensive XOR schemes described in FIGS. 6A-6E.

ADDITIONAL EMBODIMENTS

Those skilled in the art will appreciate that in some embodiments, other types of data storage systems and/or memory addressing schemes can be implemented. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Methods and processes described herein may be embodied in, and partially or fully automated via, software code modules executed by one or more general and/or special purpose computers. The word "module" may refer to logic embodied in hardware and/or firmware, or to a collection of software instructions, possibly having entry and exit points, written in a programming language, such as, for example, C or C++. A software module may be compiled and linked into an executable program, installed in a dynamically linked library, or may be written in an interpreted programming language such as, for example, BASIC, Perl, or Python. It will be appreciated that software modules may be callable from other modules or from themselves, and/or may be invoked in response to detected events or interrupts. Software instructions may be embedded in firmware, such as an erasable programmable read-only memory (EPROM). "Module" may further refer to one or more devices, components, systems, or subsystems, which may conceptually implement relevant functionality. It will be further appreciated that hardware modules may be comprised of connected logic units, such as gates and flip-flops, and/or may be comprised of programmable units, such as programmable gate arrays, application specific integrated circuits, and/or processors. The modules described herein are preferably implemented as software modules, but may be represented in hardware and/or firmware. Moreover, although in some embodiments a module may be separately compiled, in other embodiments a module may represent a subset of instructions of a separately compiled program, and may not have an interface available to other logical program units.

What is claimed is:

1. A storage device comprising:
a communication interface configured to connect to a host system;
non-volatile memory;
volatile memory; and
a storage controller associated with the non-volatile memory, the storage controller configured to:
receive data from the host system for storing in the non-volatile memory;
buffer the data in the volatile memory;
obtain parity data corresponding to the buffered data from an external volatile memory within the host system;
compute XOR parity data for the buffered data based on the parity data and the buffered data;
transfer the computed XOR parity data from the storage device to the host system via the communication interface;
store the computed XOR parity data on the external volatile memory; and
write the data from the host system to the non-volatile memory.

2. The storage device of claim 1, wherein the storage device caches the computed XOR parity data only in the external volatile memory and not in internal XOR random access memory (XRAM).

3. The storage device of claim 2, wherein the storage device does not comprise XRAM.

4. The storage device of claim 1, wherein the storage device is a solid state drive.

5. The storage device of claim 1, wherein computing the XOR parity data comprises:
computing a first set of XOR parity data for each same numbered plane page of each plane and die; and
computing a second set of XOR parity data for all pages from a particular plane.

6. The storage device of claim 1, wherein the storage controller comprises:
a first XOR engine configured to cache parity data on the external volatile memory; and
a second XOR engine configured to cache parity data on the external volatile memory.

7. The storage device of claim 6, wherein the first XOR engine and the second XOR engine are configured to operate in parallel.

8. The storage device of claim 7, wherein the first XOR engine and the second XOR engine obtain parity data from the external volatile memory in parallel.

9. The storage device of claim 8, wherein:
the first XOR engine performs an XOR calculation in a first dimension; and
the second XOR engine performs an XOR calculation in a second dimension.

10. The storage device of claim 1, wherein the storage controller is further configured to:
determine a firmware tag, a cyclic redundancy check (CRC), and an error correction code (ECC) for the computed XOR parity data stored in the external volatile memory; and
store the firmware tag, CRC, and ECC in the external volatile memory in a separate buffer from the computed XOR parity data.

11. A method of storing parity data on volatile memory external to a storage device, the method comprising:
receiving, via a communication interface, data from a host system for storing in non-volatile memory of the storage device;
buffering the data in internal volatile memory of the storage device;
obtaining parity data corresponding to the buffered data from an external volatile memory within the host system;
computing XOR parity data for the buffered data based on the parity data and the buffered data;
transferring the computed XOR parity data from the storage device to the host system via the communication interface;
storing the computed XOR parity data on the external volatile memory; and
writing the data from the host system to the non-volatile memory.

12. The method of claim 11, wherein the storage device caches the computed XOR parity data only in the external volatile memory and not in internal XOR random access memory (XRAM).

13. The method of claim 12, wherein the storage device does not comprise XRAM.

14. The method of claim 11, wherein the storage device is a solid state drive.

15. The method of claim 11, wherein computing the XOR parity data comprises:
computing a first set of XOR parity data for each same numbered plane page of each plane and die; and
computing a second set of XOR parity data for all pages from a particular plane.

16. The method of claim 11, further comprising:
performing a first XOR calculation with a first XOR engine of the storage device in a first dimension; and
performing a second XOR calculation with a second XOR engine of the storage device in a second dimension.

17. The method of claim 16, wherein the first XOR calculation and the second XOR calculation are performed in parallel.

18. The method of claim 17, wherein the first XOR engine and the second XOR engine are configured to obtain parity data from the external volatile memory in parallel.

19. The method of claim 11, further comprising:

determining a firmware tag, a cyclic redundancy check (CRC), and an error correction code (ECC) for the computed XOR parity data stored in the external volatile memory; and storing the firmware tag, CRC, and ECC in the external volatile memory in a separate buffer from the computed XOR parity data.

20. A storage device comprising:

a communication means configured to connect to a host system;

non-volatile memory means;

volatile memory means; and processing means associated with the non-volatile memory means, the processing means configured to:
- receive data from the host system for storing in the non-volatile memory means;
- buffer the data in the volatile memory means;
- obtain parity data corresponding to the buffered data from an external volatile memory within the host system;
- compute XOR parity data for the buffered data based on the parity data and the buffered data;
- transfer the computed XOR parity data from the storage device to the host system via the communication means;
- store the computed XOR parity data on the external volatile memory; and
- write the data from the host system to the non-volatile memory means.

\* \* \* \* \*